(12) United States Patent
Shapir et al.

(10) Patent No.: US 12,745,670 B2
(45) Date of Patent: Sep. 22, 2026

(54) ENCAPSULATION TECHNIQUES

(71) Applicant: ELTA SYSTEMS LTD., Lod (IL)

(72) Inventors: Itzhak Shapir, Haifa (IL); Michael Kedem, Ashdod (IL)

(73) Assignee: ELTA SYSTEMS LTD., Lod (IL)

( * ) Notice: Subject to any disclaimer, the term of this patent is extended or adjusted under 35 U.S.C. 154(b) by 903 days.

(21) Appl. No.: 17/927,601

(22) PCT Filed: May 11, 2021

(86) PCT No.: PCT/IL2021/050532

§ 371 (c)(1), (2) Date: Nov. 23, 2022

(87) PCT Pub. No.: WO2021/240499

PCT Pub. Date: Dec. 2, 2021

(65) Prior Publication Data

US 2023/0215773 A1 Jul. 6, 2023

(30) Foreign Application Priority Data

May 26, 2020 (IL) ........................................ 274946

(51) Int. Cl.

| | |
|---|---|
| ***H01L 23/24*** | (2006.01) |
| ***H01L 21/56*** | (2006.01) |
| ***H01L 23/29*** | (2006.01) |
| ***H01L 23/31*** | (2006.01) |
| ***H01L 23/66*** | (2006.01) |
| ***H01L 25/065*** | (2023.01) |
| ***H10W 44/20*** | (2026.01) |
| ***H10W 74/01*** | (2026.01) |
| ***H10W 74/10*** | (2026.01) |
| ***H10W 74/47*** | (2026.01) |
| ***H10W 76/47*** | (2026.01) |
| ***H10W 90/00*** | (2026.01) |

(52) U.S. Cl.

CPC .......... *H10W 76/47* (2026.01); *H10W 44/20* (2026.01); *H10W 74/016* (2026.01); *H10W 74/114* (2026.01); *H10W 74/47* (2026.01); *H10W 90/00* (2026.01); *H10W 44/241* (2026.01)

(58) Field of Classification Search

CPC ... H01L 23/24; H01L 23/293; H01L 23/3121; H01L 23/66; H01L 21/565; H01L 25/0655; H01L 2223/6672; H10W 76/47; H10W 74/114; H10W 74/47; H10W 74/016; H10W 44/20; H10W 44/241; H10W 90/00

See application file for complete search history.

(56) References Cited

U.S. PATENT DOCUMENTS

| | | | | |
|---|---|---|---|---|
| 5,889,232 | A * | 3/1999 | Ichikawa | H01L 23/295 257/E23.126 |
| 7,700,414 | B1 | 4/2010 | San et al. | |
| 9,346,668 | B1 | 5/2016 | Dreiza et al. | |

(Continued)

*Primary Examiner* — Peniel M Gumedzoe
(74) *Attorney, Agent, or Firm* — Ballard Spahr LLP

(57) ABSTRACT

An integrated circuit (IC) assembly and a method for encapsulating of IC are presented. The IC assembly comprises an IC substrate having one or more micro-devices, at least one dielectric matrix element placed on said IC substrate over at least one of its one or more micro-devices; and an encapsulation element applied over said IC substrate and said at least one dielectric matrix element placed thereon to enclose and seal said IC substrate.

15 Claims, 4 Drawing Sheets

(56) References Cited

U.S. PATENT DOCUMENTS

| | | | |
|---|---|---|---|
| 10,410,963 | B1 | 9/2019 | Weis et al. |
| 2003/0159262 | A1 | 8/2003 | Hom et al. |
| 2007/0035001 | A1 | 2/2007 | Kuhmann et al. |
| 2012/0067871 | A1 | 3/2012 | Sherrer et al. |
| 2014/0268625 | A1 | 9/2014 | Sherrer et al. |
| 2016/0133537 | A1 | 5/2016 | Shih et al. |
| 2017/0103973 | A1 | 4/2017 | Yu et al. |
| 2017/0338161 | A1 | 11/2017 | Koba et al. |

* cited by examiner 12m
12
12q
12g
13c
13c
11
11d 13
15

12
11d
13
11
18
12m
15
12
11d 13
11
12u
12

12p
12u
12

12h
12u
12

12r
12e
12
12
12

12p

12h 14s
12
12
11
11
11
13

14
14
14
14c
14c
14c
14s
12
12
13
11
11
11

14
14
12
14
12
12
13
11
11
11

15
14
14
12
14
12
12
13
11
11
11

15
12
12
12
13
11
11
11

ENCAPSULATION TECHNIQUES

TECHNOLOGICAL FIELD

The present invention is generally in the field of encapsulation and packaging of integrated circuitries, particularly high frequency circuitries.

BACKGROUND

Integrated circuits (IC) formed on (or in) semiconductor substrates typically utilize a plurality of electric and electronic components (e.g., resistors, capacitors, inductors, transistors diodes, etc.) implemented in the semiconductor substrate by microelectronic equivalents. After IC fabrication is completed, and the semiconductor substrate is mounted and electrically coupled to a circuit board, it is encapsulated by a protective element/coat designed to prevent physical damage and corrosion thereto, while providing electrical connectivity to the circuit board. The encapsulating element/coat is designed to protect the IC from structural damage and contamination and minimize RF losses without degrading performance of the micro-devices implemented in the IC. It is also required that the encapsulating element/coat be inexpensive and easy to implement, and that it occupies as little space as possible.

There is an ongoing demand in the industry for increased density of the micro-devices implemented in ICs by miniaturisation, and for higher operating frequencies thereof. However, these demands usually results in reduced reliability and increased energy consumption due to parasitic currents. These deficiencies can be mitigated to some extent by proper electrical insulation of IC components, such as, high radio frequency (RF) micro-devices. Such electrical insulation can be achieved by air gaps formed between the substrate and the encapsulating element/coat. For this purpose, cap elements are typically placed over specific micro-devices (e.g., microelectromechanical systems—MEMS, RF devices, RF MEMS) requiring such an air gap for optimizing their performance.

Wafer-level packaging techniques can provide cost effective solutions, and improved reliability. For example, wafer-level bonding can be used to from air gaps over micro-devices by attaching a capping wafer on ring sealing elements bonded to the substrate to encircle the micro-devices, which, however, results in a significantly increased footprint and high aspect ratio. Another possible solution utilizes metal caps attached (e.g., by soldering or bonding) to the substrate (or the circuit board) over the micro-devices but using such metallic capping elements entails inevitable RF losses. RF loses can be minimized using glass-based capping elements, but the bonding temperatures typically required for attaching such glass-based caps can damage the micro-devices of the IC.

Reduced capping profiles can be achieved by thin film encapsulation techniques, which typically applied utilizing sacrificial deposit to cover the micro-device to be protected. The sacrificial deposit is covered by a cap film deposition, and the sacrificial deposit is then removed by etching access apertures and/or thermal decomposition to form the air gap. After the sacrificial deposit is removed, the access apertures are sealed by a sealing film applied over the cap film. Accordingly, such film encapsulation techniques are complex, time consuming and expensive to implement.

Some capping solutions known from the patent literature are briefly described hereinbelow.

US Patent Publication No. 2007/0035001 describes a package including a sensor die with a micro component, such as a MEMS device, coupled to an integrated circuit which may include, for example, CMOS circuitry, and one or more electrically conductive bond pads near the periphery of the sensor die. A semiconductor cap structure is attached to the sensor die. The front side of the cap structure is attached to the sensor die by a seal ring to hermetically encapsulate an area of the sensor die where the micro component is located. The bond pads on the sensor die are located outside the area encapsulated by the seal ring. Electrical leads, which extend along outer side edges of the semiconductor cap structure from its front side to its back side, are coupled to the micro component via the bond pads.

US Patent Publication No. 2017/338161 describes an air cavity package including a flange and a pedestal extending upward from the flange. A dielectric frame is joined to the flange and surrounds the pedestal. The semiconductor die is placed on the pedestal, which reduces the length of the wires joining the die to the leads of the air cavity package.

GENERAL DESCRIPTION

The capping techniques used nowadays to form air gaps between IC micro-devices and the encapsulating element/coat of the IC substantially increase production costs and complexity. Placing the capping elements over the micro-devices that require formation of the air gaps for their proper operation requires careful design of the capping elements and of the wiring of the covered micro-devices. In addition, the use of such conventional capping elements prohibits construction of multilayered circuit board structures which include embedded components, as can be achieved by circuit board bonding techniques.

The present invention overcomes these deficiencies by using types of dielectric breathable/permeable films or foils, and/or cellular films or foils (generally referred to herein as dielectric matrix elements), that introduce a very low, air-like dielectric constant, instead of the conventional capping elements that introduce significantly higher dielectric constant and cause deviation of RF performance of the encapsulated component or components. After placing the dielectric matrix elements over micro-devices of the IC, an encapsulation element/coat is applied thereover for physical and electric insulation and protection. This way, an electrically insulating gap can be easily formed between the micro-devices covered by the dielectric matrix elements and the encapsulating element/coat covering the IC substrate. The dielectric matrix elements used can be implemented by a substantially thin layer (about 100 to 300 micrometer) of the dielectric matrix element placed over micro-devices of the IC. The encapsulation element/coat can be implemented, for example, by any suitable type of plastic or resin mold such as, but not limited to, low pressure molding (LPM) of epoxy or any other resin.

The term dielectric matrix is used herein to generally refer to thin cellular, and/or breathable/permeable films or foils, made of dielectric and/or electrically insulating materials, such as, but not limited to, Teflon, Polystyrene and/or any other suitable type of insulating material capable of holding gaseous substances (e.g., air or other fluid substance) therewithin. For example, and without being limiting, the dielectric matrix can be configured to define a plurality of open, or closed, cells filled with air, or other fluid substance having suitable dielectric/electrically insulating properties (e.g., low conductivity, low RF loss factor, and/or a desired level of high voltage protection). Other configurations of the dielectric matrix elements are also possible, having, for example, interwoven webs, loops, hooks, and/or bristle-like elements, capable of defining fluid/air filled passages and/or volumes/cavities between the IC substrate and its encapsulating element.

Placing such thin dielectric matrix elements on the IC substrate is much simpler and faster than attaching the conventional capping elements used nowadays. The dielectric matrix elements can be placed directly over respective IC substrates. Optionally, but in some embodiments preferably, the dielectric matrix elements are initially attached (e.g., by glue) to a thin (e.g., having thickness between 100 to 3000 micrometers, alternatively 100 to 1000 micrometers, optionally 100 to 500 micrometers) aligning carrier/element (e.g., made of plastic) configured to accurately place the dielectric elements on their respective IC substrates.

For example, a back side (the side not facing the IC) of the dielectric elements can be attached to the aligning carrier and then placed on the IC substrate(s) (e.g., with a dot of glue on a front side of the dielectric elements) by means of the aligning element/carrier, to allow manipulating and aligning them for better attachment. The dielectric matrix elements, and/or the aligning element carrying them, can be placed on the IC substrates utilizing standard pick-and-place tools (e.g., with accuracy of 7-10 micrometers). The aligning element/carrier can be then attached (e.g., by glues) over the IC substrate, or at least partially removed, after accurately aligning and positioning each dielectric matrix element over its respective micro-device of the IC.

The aligning carrier/element can be configured to attach over a portion, or the entire surface area, of the circuit board to which one or more IC substrates are attached and electrically coupled (e.g., as a system in package—SIP) for accurately aligning and placing dielectric matrix elements thereby carried over respective micro-device elements of the one or more IC substrates. The aligning element can be partially, or entirely, removed (e.g., by maintaining portions thereof where needed to improve electrical performance, and avoiding other portions thereof from locations wherein it is not needed or might degrade performance) after the dielectric matrix elements are properly placed over the micro-devices. In some embodiments some portion of the aligning element is maintained over each dielectric matrix element, and thereafter encapsulated theretogether as the encapsulating element/coat is applied.

Due to the reduced size/profile of the dielectric matrix elements, bonding and wiring techniques can be used to assemble multilayered circuit structures by attaching one or more electrically coupled circuit boards to form a stack of circuit boards on top the encapsulation element/coat covering the dielectric matrix elements. Such multilayered stacks of electrically coupled circuit boards is not achieved with the conventional capping techniques relying on attachment of capping elements over micro-devices of IC substrates because they require lid(s) having vertical vias for electrical connectivity, that outcomes in complex and difficult of assembly. The encapsulation techniques disclosed hereon overcome these deficiencies by applying the encapsulation over the dielectric matrix elements placed IC substrates, which is straight forward, and provides repeatable mechanical and electrical results.

One inventive aspect of the subject matter disclosed herein relates to an integrated circuit (IC) assembly comprising an IC substrate having one or more micro-devices, at least one dielectric matrix element placed on the IC substrate over at least one of its one or more micro-devices, and an encapsulation element (e.g., comprising a plastic or resin mold) applied over the IC substrate and the at least one dielectric matrix element placed thereon to enclose and seal the IC substrate. The assembly comprises in some embodiments at least one spacer element placed on the at least one dielectric matrix element for partitioning between the at least one dielectric matrix element and the encapsulation element. The at least one spacer element can be a detachable element removed from an aligning element configured to accurately place the at least one dielectric matrix element on the IC substrate.

The at least one spacer element can be implemented by a sheet of electrically insulating material having thickness in a range of 0.1 to 0.3 millimeters. In some embodiments the at least one dielectric matrix element is made of a thin film or foil. Optionally, the at least one dielectric matrix element comprises at least one of a breathable material, a permeable material, a cellular material, and/or a fibrous material. The at least one dielectric matrix element comprises in possible embodiments a plurality of loop, hook, and/or bristle elements.

Optionally, but in some embodiments the assembly comprises a circuit board electrically coupled to the IC substrate and its one or more micro-devices. One or more electrical conductors electrically coupled to the circuit board and extending through the encapsulation element can be used to provide electrical connectivity to the circuit board.

Another inventive aspect of the subject matter disclosed herein relates to a multilayered circuit structure comprising at least one IC assembly as disclosed hereinabove or hereinbelow and at least one additional circuit board having one or more devices and/or ICs attached thereto. The at least one additional circuit board can be attached and electrically coupled to the at least one IC assembly to form a stacked circuitry structure. Optionally, but in some embodiments preferably, the multilayered circuit structure comprises one or more electrical conductors electrically extending through the encapsulation element to provide electrical connectivity between the at least one IC assembly and the at least one additional circuit board. At least one via can be formed in the at least one additional circuit board for establishing electrical connectivity with at least one of the one or more electrical conductors.

Yet another inventive aspect of the subject matter disclosed herein relates to a method of encapsulating an integrated circuit comprising one or more micro-devices. The method comprising placing at least one dielectric matrix element on the IC substrate over at least one of its one or more micro-devices and applying an encapsulation mold over the IC substrate and the at least one dielectric matrix element placed thereon to enclose and seal the IC substrate. The placing of the at least one dielectric matrix element may comprise placing it with a spacer element thereon. Optionally, the method comprises adhering the at least one dielectric matrix element to the IC substrate.

In some embodiments the placing of the at least one dielectric matrix element comprises attaching the at least one dielectric matrix element to a carrier element configured to facilitate accurate placement of the at least one dielectric matrix element on the IC substrate. The method optionally comprises removing the carrier element before applying the encapsulation coat. The removing of the carrier element can comprise detaching at least one portion of the carrier element located on the at least one dielectric matrix element and leaving it thereon.

A yet another inventive aspect of the subject matter disclosed herein relates to a method of constructing a multilayered circuit structure comprising attaching at least one circuit board on top of the IC encapsulated by the methods and processes described hereinabove and hereinbelow, and electrically coupling the at least one circuit board and the encapsulated IC. Optionally, the electrically coupling comprises forming one or more vias in the at least one circuit board.

Another inventive aspect of the subject matter disclosed herein relates to a dielectric matrix element configured to accommodate a dielectric gas or fluid between an integrated circuit (IC) substrate and an encapsulation element of the IC substrate, to thereby provide air-gap-like conditions to at least one micro-device formed in or on the IC substrate. The dielectric matrix can comprise a breathable or permeable material. Optionally, the dielectric matrix element comprises fibrous, mesh, and/or perforated material. The dielectric matrix element can alternatively, or additionally, comprise at least one of loop elements, hook elements, bristle elements, open or closed cells or cavities, or any combination thereof.

BRIEF DESCRIPTION OF THE DRAWINGS

In order to understand the invention and to see how it may be carried out in practice, embodiments will now be described, by way of non-limiting example only, with reference to the accompanying drawings. Features shown in the drawings are meant to be illustrative of only some embodiments of the invention, unless otherwise implicitly indicated. In the drawings like reference numerals are used to indicate corresponding parts, and in which.

DETAILED DESCRIPTION OF EMBODIMENTS

Figures 1A, 1B, 1C, 2A, 2B, 2C, 2D, 2E, 2F:
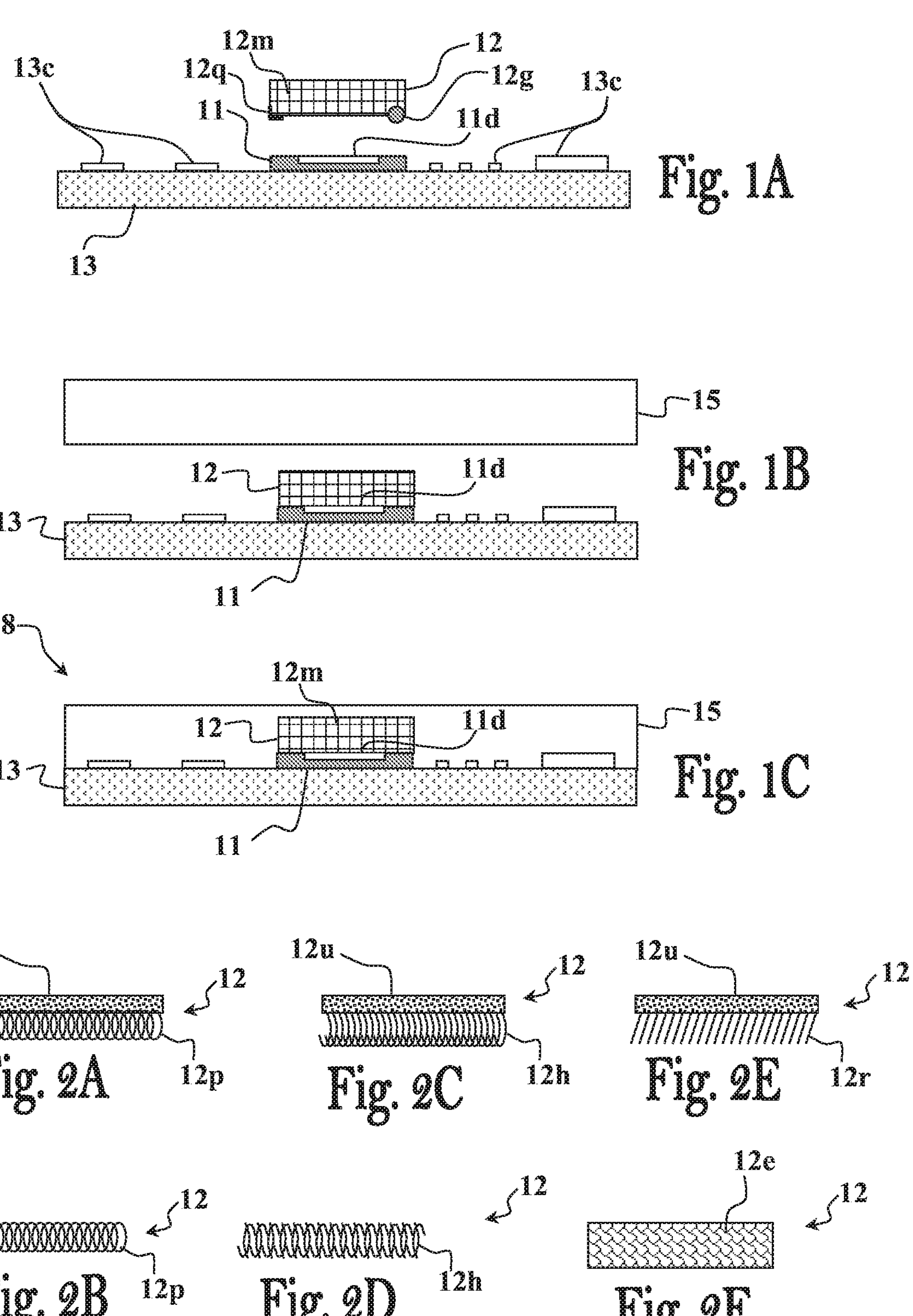
FIGS. 1A to 1C schematically illustrates an encapsulation process according to some possible embodiments.
FIGS. 2A to 2F schematically illustrates different possible implementations of the dielectric matrix element according to some possible embodiments.

One or more specific embodiments of the present disclosure will be described below with reference to the drawings, which are to be considered in all aspects as illustrative only and not restrictive in any manner. In an effort to provide a concise description of these embodiments, not all features of an actual implementation are described in the specification. Elements illustrated in the drawings are not necessarily to scale, or in correct proportional relationships, which are not critical. Emphasis instead being placed upon clearly illustrating the principles of the invention such that persons skilled in the art will be able to use the encapsulation techniques, once they understand the principles of the subject matter disclosed herein. This invention may be provided in other specific forms and embodiments without departing from the essential characteristics described herein.

The present application provides techniques for encapsulating high-frequencies IC substrates (dies) without the conventional capping elements, while maintaining high performance of micro-devices of the encapsulated IC. In the encapsulation techniques disclosed herein, instead of forming an air-gap by a capping element, a thin dielectric matrix element is placed over at least some portion of the IC substrate before it is encapsulated in a mold (e.g., plastic, resin, epoxy). The dielectric matrix element placed over the IC substrate is designed to present dielectric properties very similar to those presented by the conventional air-gaps, to thereby optimize performance of the IC in operation. These encapsulation techniques can thus substantially simplify the production process, provide improved reliability, reduce the production costs, and permits construction of multilayered circuit boards structures stacked one on top of the other.

In some embodiments the dielectric matrix element is made from a type of foam, or perforated or fibrous material, configured to enclose air, or another fluid, over portions of the IC substrate thereby covered. One or more dielectric matrix elements can be attached on a thin aligning sheet (e.g., made of plastic) for accurately placing then over specific locations for covering micro-devices of the IC substrate(s). The IC substrate(s) may be attached and electrically coupled to a circuit board (e.g., a printed circuit board—PCB). The aligning sheet can be removed after placing the dielectric matrix elements over the IC substrates, but in some embodiments its geometrical dimensions and thickness are configured to permit keeping it, or portions thereof, in place over the IC substrate and covering it, with the dielectric matrix element located therebeneath, by the encapsulating element/coat (e.g., plastic or resin mold).

For an overview of several example features, process stages, and principles of the invention, the encapsulation examples illustrated schematically and diagrammatically in the figures are intended for IC substrates comprising high frequency micro-devices. These encapsulation techniques are shown as possible example implementations that demonstrate a number of features, processes, and principles used to provide air-gap-like conditions, but they are also useful for other types of micro-devices (e.g., MEMS) and can be made in different variations. Therefore, this description will proceed with reference to the shown examples, but with the understanding that the invention recited in the claims below can also be implemented in myriad other ways, once the principles are understood from the descriptions, explanations, and drawings herein. All such variations, as well as any other modifications apparent to one of ordinary skill in the art and useful in encapsulation of IC substrates may be suitably employed and are intended to fall within the scope of this disclosure.

FIGS. 1A to 1C schematically illustrate encapsulation of an IC substrate 11 according to some possible embodiments. In this specific and non-limiting example, the IC substrate 11 is mechanically attached and electrically coupled to a circuit board 13, which may comprise other electric/electronic components and/or IC circuits 13*c*. The IC substrate 11 comprises at least one micro-device 11*d* (e.g., high frequency RF device) requiring enhanced electrical insulation conditions for optimized operation. As shown in FIG. 1B, after it is attached and electrically coupled to the circuit board 13, a dielectric matrix element 12 is placed over the IC substrate 11 to cover its at least one micro-device 11*d*.

Optionally, the dielectric matrix element 12 is adhered to the IC substrate. For example, by applying a small drop of glue 12*g* on a bottom face thereof (the side facing the IC substrate 11), and/or on a top side of the IC substrate 11 (not shown), and placing the dielectric matrix element 12 on top the IC substrate 11. It is however noted that use of glue 12*g* is not necessarily required and can be avoided in some embodiments.

After the dielectric matrix element 12 is placed on the IC substrate an encapsulation element/coat 15 (e.g., plastic mold) is applied onto the IC substrate 11 to cover and seal at least the IC substrate, or the entire surface of the circuit board 13 carrying the IC substrate 11. As seen in FIG. 1C, the encapsulation element/coat 15 secures and seals the dielectric matrix element 12, and thus adhesion thereof to the IC substrate 11 by glue (12*g*) is not necessarily required. For example, in some embodiments the dielectric matrix element 12 is configured as a sticky/adhesive patch having limited adhesion areas (12*q* in FIG. 1A), for example, distributed about the periphery/boundaries of the dielectric matrix element 12.

While in some embodiments only a drop of glue 12*g* is used on the bottom face of the dielectric matrix element 12, in other possible embodiments it can be replaced by, or used in addition to, the adhesion areas 12*q*, or avoided altogether. The encapsulated circuitry 18 obtained can of course include additional IC substrates 11 having respective dielectric matrix elements 12 covering micro-devices thereof, if so needed. The glue 12*g* and/or the adhesion areas 12*q* can be used on the bottom face of the dielectric matrix element 12 of any of the embodiments disclosed herein.

In some embodiments the dielectric matrix element 12 comprises a plurality of open, or closed, cells or cavities 12*m* configured to contain a dielectric gas (e.g., air), or another suitable fluid substance. Optionally, but in some embodiments preferably, the dielectric matrix element 12 is implemented by a type of solid foam material configured to enclose air (or other gas/fluid) in closed cells/bubbles thereof, such as, but not limited to, ROHACELL foam manufactured by EVONIK.

FIG. 2 shows possible implementations of the dielectric matrix element 12 according to possible embodiments. FIG. 2A shows a dielectric matrix element 12 comprised of a plurality of loop elements 12*p* attached to a thin support element (e.g., film or foil) 12*u*. FIG. 2B shows a dielectric matrix element 12 comprised of a plurality of loop elements 12*p* entangled one with the other to construct a thin matrix element without a support element (12*u*). FIG. 2C shows a dielectric matrix element 12 comprised of a plurality of hook elements 12*h* attached to a thin support element (e.g., film or foil) 12*u*. FIG. 2D shows a dielectric matrix element 12 comprised of a plurality of hook elements 12*p* entangled one with the other to construct a thin matrix element without a support element (12*u*). FIG. 2E shows a dielectric matrix element 12 comprised of a plurality of bristle elements 12*r* attached to a thin support element (e.g., film or foil) 12*u*. FIG. 2F shows a dielectric matrix element 12 comprised of breathable/permeable mesh configured to form a plurality of open passages 12*e* configured to accommodate air (or other fluid). It is noted that the dielectric matrix element 12 can be implemented by any suitable combination of the elements shown and described with reference to FIGS. 2A-F.

The dielectric matrix element 12 can be fabricated from any suitable dielectric and/or electrically insulating material e.g., plastic, Teflon, Polystyrene, but many other types of electrically insulating materials are also possible (e.g., G10, Polycarbonate). The thickness of the dielectric matrix element 12 can generally be about 100 to 3000 micrometers, optionally about 200 micrometers. The encapsulation element/coat 15 can be implemented by a suitable electrically insulating material (e.g., plastic or epoxy mold) applied at least over the IC substrate 11 to secure and seal the dielectric matrix element 12 thereover. As shown, in possible embodiments, the encapsulation element/coat 15 is applied over the surface of the circuit board 13. The thickness of the encapsulation element/coat 15 can generally be about 0.3 to 3 millimeters, optionally about 0.8 millimeters.

Figure 3:
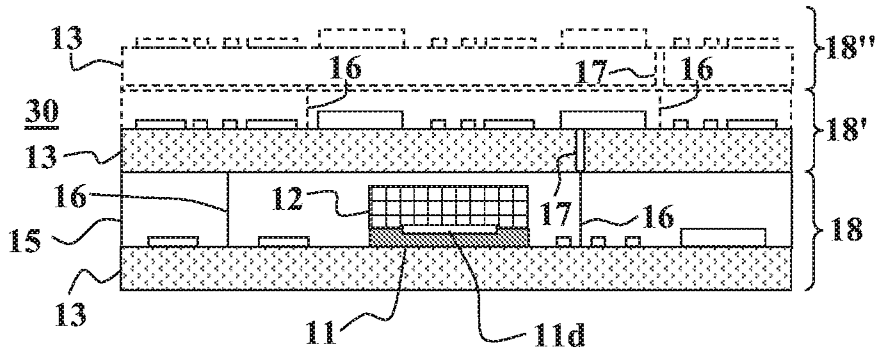
FIG. 3 schematically illustrates a layered circuit board structure according to some possible embodiments.

FIG. 3 shows a stack of multilayered circuit board structure 30 according to some possible embodiments. As seen, in this specific and non-limited example one or more circuit boards 18', 18" . . . are attached and electrically linked one to the other on top of the encapsulated circuitry 18. The circuit boards can be attached using any suitable multilayer circuit boards (MLB) bonding technique known in the art (e.g., using adhesive/bonding films). The circuitries of the multilayered circuit board structure 30 are electrically linked in this example by conductors 16 vertically extending between the circuit boards to electrically connect between devices and/or IC circuitries thereof. If needed, vias 17 can be used to electrically connect between the devices and/or IC circuitries of multilayered circuit board structure 30. Such multilayered circuit structures can be constructed with other possible embodiments disclosed herein e.g., having more than one IC substrate 11 and respective dielectric matrix elements 12.

Figure 4A:
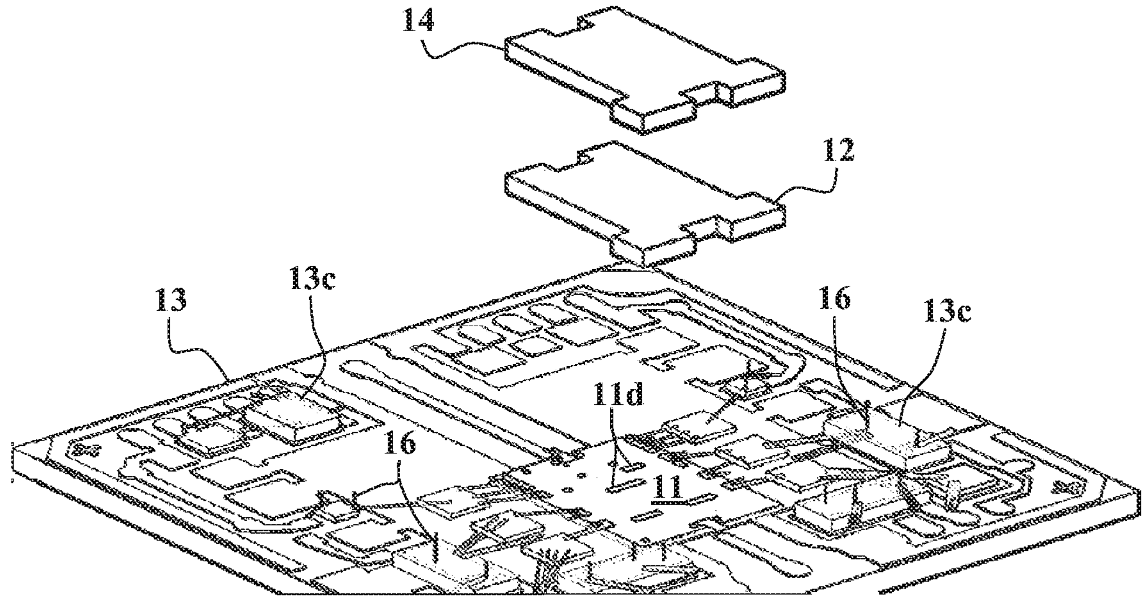
FIGS. 4A to 4C schematically illustrate an encapsulation process according to some possible embodiments.
Figure 4B:
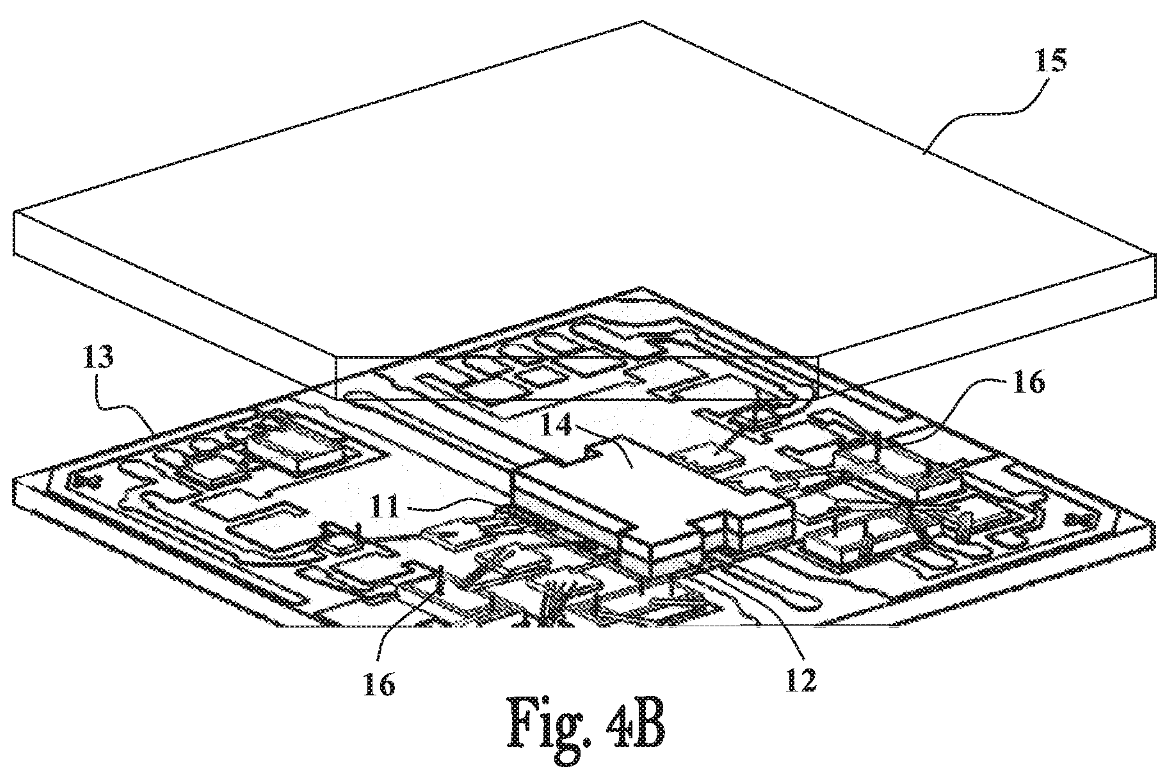
Figure 4C:
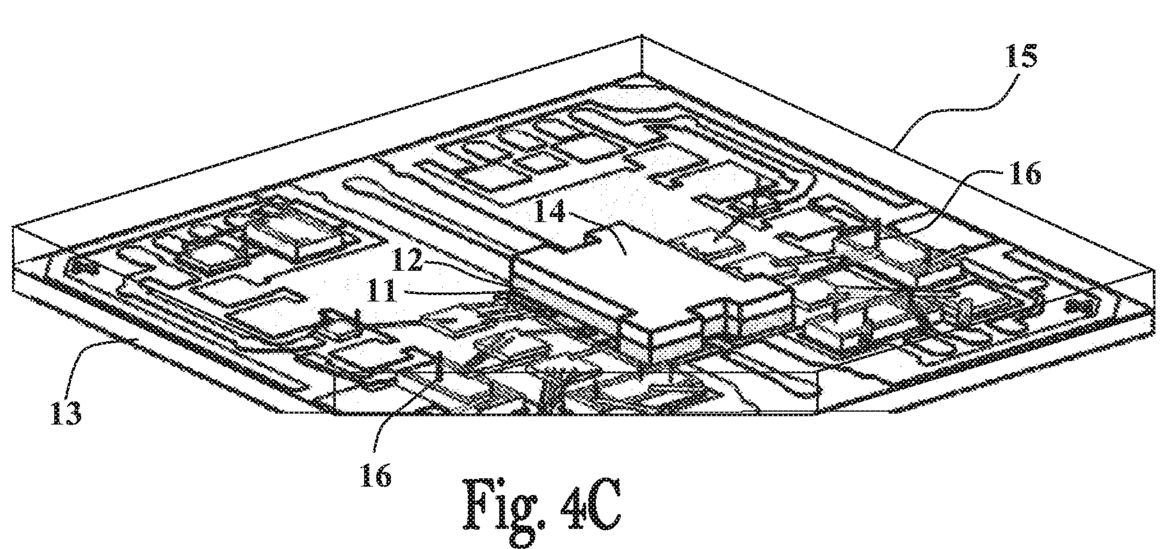

FIGS. 4A to 4C schematically illustrate an encapsulation process according to some possible embodiments. In FIG. 4A a circuit board 13 in shown having one or more devices 13*c*, and an IC substrate 11 having one or more micro-devices 11*d*, mounted and electrically connected thereon. The circuit board 13 may also have conductors 16 vertically extending therefrom to provide electrical connectivity to its one or more devices 13*c* and IC substrate 11. Before applying an encapsulation element/coat, a thin dielectric matrix element 12 is placed to cover at least some portion of the IC substrate 11 including the one or more micro-devices 11*d* requiring air gap conditions for their operation.

In this specific and non-limiting example, a thin spacer element 14 is placed over the dielectric matrix element 12 for partitioning between the dielectric matrix element 12 and the encapsulation element/coat, and/or to allow better manipulation (positioning), assembly and robustness. The spacer element 14 can be implemented by a thin electrically insulating film or foil (e.g., made of plastic, G10, PEEK, ULTEM), having thickness generally about 0.1 to 0.2 millimeters, optionally about 0.1 millimeters. The dielectric matrix element 12 can be attached to the IC substrate by any suitable adhesive material (12*g* in FIG. 1A). Optionally, the dielectric matrix element 12 is configured as an adhesive/sticky patch element configured to attach to the IC substrate once it is placed thereon. The spacer element 14 can be attached to the dielectric matrix element 12 by any suitable adhesive material. Optionally, the spacer element 14 is configured as an adhesive/sticky patch element configured to attach to the dielectric matrix element 12 once it is placed thereon.

FIG. 4B shows the circuit board 13 after the dielectric matrix element 12 is attached on top the IC substrate 11, and the spacer element 14 is attached to the dielectric matrix element 12, and before the encapsulation element/coat 15 is applied thereover. FIG. 4C shows the circuit board 13 after the encapsulation element/coat 15 is applied thereover. The dielectric matrix element 12 can be implemented by any of the configurations described hereinabove and hereinbelow, and with similar geometrical dimension, and also the encapsulation element/coat 15.

Figures 5A, 5B, 5C, 5D, 5E:
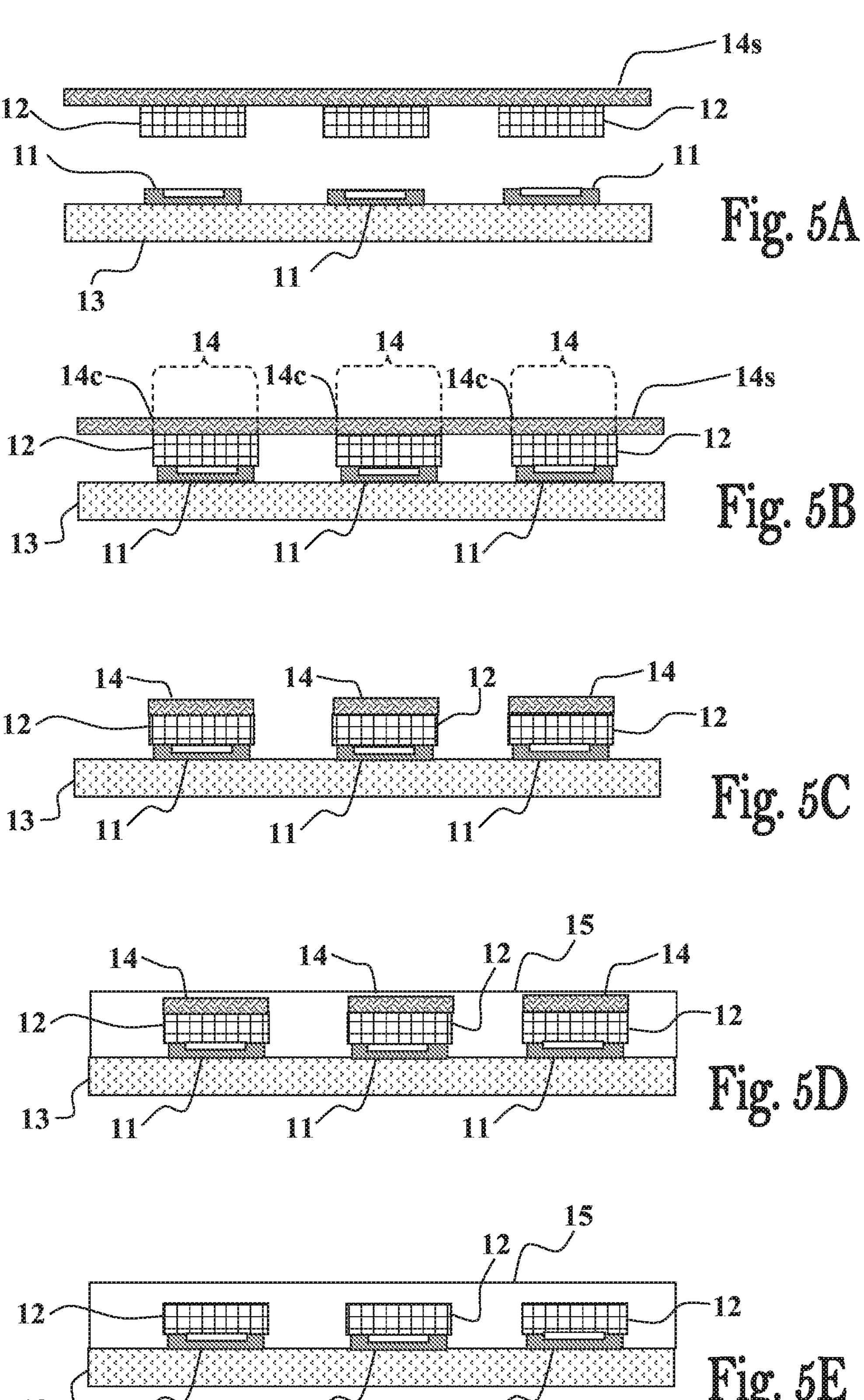
FIGS. 5A to 5E schematically illustrates another encapsulation process according to some possible embodiments.

FIGS. 5A to 5E schematically illustrate another encapsulation process usable for concurrently placing a plurality of dielectric matrix elements 12 over a respective plurality of IC substrates 11 attached and electrically coupled to a circuit board 13. FIG. 5A shows an aligning element 14*s* having a plurality of dielectric matrix elements 12 attached over one face thereof. As seen in FIG. 5B, the aligning element 14*s* is configured to facilitate accurate alignment and placement of each dielectric matrix element 12 over a respective one of the IC substrates 11 of the circuit board 13.

Optionally, the aligning element 14*s* is removed after the dielectric matrix elements 12 are placed over their respective IC substrates 11, and the encapsulation element/coat is 15 then applied to secure and seal the dielectric matrix elements 12 thereover, as exemplified in FIG. 5E.

In some embodiments some portion of the aligning element 14*s* is maintained over at least some of the dielectric matrix elements 12, as seen in FIG. 5C. This is achieved, in some possible embodiments, by applying detachment cuts (14*c* in FIG. 5B) to the aligning element 14*s* for easily removing it after the dielectric matrix elements 12 are placed over the respective IC substrates 11, while maintaining portions 14 thereof in place over the dielectric matrix elements 12. The aligning element 14*s* can be implemented by a flat sheet made of any material suitable for carrying the dielectric matrix elements 12 and accurately placing them on the IC substrates 11.

If the aligning element 14*s* is configured to detach portions 14 thereof over the dielectric matrix elements 12, then it is preferably made of an electrically insulating material having suitable thickness (e.g., about 0.1 to 0.3 millimeters for encapsulating it with the other components. FIG. 5D shows the circuit board 13 with the dielectric matrix elements 12 and the spacer elements 14 left over them after the aligning element 14*s* is removed, and the encapsulation element/coat 15 is applied. The dielectric matrix element 12 can be implemented by any of the configurations described hereinabove and hereinbelow, and with similar geometrical dimension, and also the encapsulation element/coat 15.

Terms such as top, bottom, front, back, right, and left and similar adjectives in relation to orientation of the encapsulated circuits and components thereof refer to the manner in which the illustrations are positioned on the paper, not as any limitation to the orientations in which the encapsulated IC substrate can be used in actual applications. It should also be understood that throughout this disclosure, where a process or method is shown or described, the steps of the method may be performed in any order or simultaneously, unless it is clear from the context that one step depends on another being performed first.

As described hereinabove and shown in the associated figures, the present invention provides ICs encapsulation techniques and related methods. While particular embodiments of the invention have been described, it will be understood, however, that the invention is not limited thereto, since modifications may be made by those skilled in the art, particularly in light of the foregoing teachings. As will be appreciated by the skilled person, the invention can be carried out in a great variety of ways, employing more than one technique from those described above, all without exceeding the scope of the claims.

The invention claimed is:

1. An integrated circuit (IC) assembly, comprising:
- an IC substrate having one or more micro-devices;
- at least one dielectric matrix element placed on said IC substrate over at least one of its one or more micro-devices; and
- an encapsulation element applied over said IC substrate and said at least one dielectric matrix element placed thereon to enclose and seal said IC substrate; and
- at least one spacer element placed on the at least one dielectric matrix element, the at least one spacer element partitioning between the at least one dielectric matrix element and the encapsulation element, and
- wherein the at least one spacer element is a detached portion removed from an aligning element configured to accurately place the at least one dielectric matrix element on the IC substrate; and
- wherein the at least one dielectric matrix element comprises a plurality of loop, hook, and/or bristle elements.

2. The IC assembly of claim 1 wherein the at least one spacer element is a sheet of electrically insulating material having thickness in a range of 0.1 to 0.3 millimeters.

3. The IC assembly of claim 2, wherein the at least one dielectric matrix element is made of at least one of: a thin film or foil, a breathable material, a permeable material, a cellular material, a fibrous material.

4. The IC assembly of claim 1, wherein the at least one dielectric matrix element is made of at least one of: a thin film or foil, a breathable material, a permeable material, a cellular material, a fibrous material.

5. The IC assembly of claim 1, wherein the encapsulation element comprises plastic or resin mold.

6. The IC assembly of claim 1, further comprising a circuit board electrically coupled to the IC substrate and its one or more micro-devices.

7. The IC assembly of claim 6, further comprising one or more electrical conductors electrically coupled to the circuit board and extending through the encapsulation element to provide electrical connectivity to said circuit board.

8. The IC assembly of claim 1, wherein the at least one dielectric matrix element is made of at least one of: a thin film or foil, a breathable material, a permeable material, a cellular material, or a fibrous material.

9. A multilayered circuit structure, comprising: at least one integrated circuit (IC) assembly and at least one additional circuit board having one or more devices and/or ICs attached thereto, the at least one IC assembly comprising:
- an IC substrate having one or more micro-devices;
- a circuit board electrically coupled to the IC substrate and its one or more micro-devices;
- at least one dielectric matrix element placed on said IC substrate over at least one of its one or more micro-devices; and
- an encapsulation element applied over said IC substrate and said at least one dielectric matrix element placed thereon to enclose and seal said IC substrate;
  - wherein said at least one additional circuit board is attached and electrically coupled to said at least one IC assembly to form a stack structure.

10. The multilayered circuit structure of claim 9, further comprising one or more electrical conductors electrically extending through the encapsulation element to provide electrical connectivity between the at least one IC assembly and the at least one additional circuit board.

11. The multilayered circuit structure of claim 10, further comprising at least one via formed in the at least one additional circuit board for establishing electrical connectivity with at least one of the one or more electrical conductors.

12. A method of encapsulating an integrated circuit (IC) including one or more micro-devices, the method comprising:
- placing at least one dielectric matrix element on an IC substrate over at least one of one or more micro-devices thereof; and
- applying an encapsulation mold over said IC substrate and said at least one dielectric matrix element placed thereon to enclose and seal said IC substrate;
- wherein the placing of the at least one dielectric matrix element comprises attaching the at least one dielectric matrix element to a carrier element configured to facilitate accurate placement of the at least one dielectric matrix element on the IC substrate.

13. The method of claim 12, further comprising placing the at least one dielectric matrix element with a spacer element thereon.

14. The method of claim 12, further comprising removing the carrier element before applying the encapsulation coat.

15. The method of claim 14 wherein the removing of the carrier element comprises detaching at least one portion of the carrier element located on said at least one dielectric matrix element.

* * * * *